(12) United States Patent
Chen

(10) Patent No.: US 7,530,890 B2
(45) Date of Patent: May 12, 2009

(54) QUICKLY DETACHED COOLING FAN MOUNTING BRACKET FOR COMPUTER

(75) Inventor: Shih-Tsung Chen, Taipei (TW)

(73) Assignee: Shuttle Inc., Taipei (TW)

( * ) Notice: Subject to any disclaimer, the term of this patent is extended or adjusted under 35 U.S.C. 154(b) by 405 days.

(21) Appl. No.: 10/879,115

(22) Filed: Jun. 30, 2004

(65) Prior Publication Data
US 2006/0003683 A1    Jan. 5, 2006

(51) Int. Cl.
*H05K 5/00* (2006.01)
(52) U.S. Cl. ............................ 454/184; 361/695; 361/696
(58) Field of Classification Search ................ 454/184; 361/695, 696; 312/236
See application file for complete search history.

(56) References Cited

U.S. PATENT DOCUMENTS

| | | | | | |
|---|---|---|---|---|---|
| 5,428,503 | A | * | 6/1995 | Matsushima et al. | 361/695 |
| 5,460,441 | A | * | 10/1995 | Hastings et al. | 312/298 |
| 5,673,175 | A | * | 9/1997 | Carney et al. | 361/686 |
| 5,707,282 | A | * | 1/1998 | Clements et al. | 454/184 |
| 5,788,566 | A | * | 8/1998 | McAnally et al. | 454/184 |
| 5,790,372 | A | * | 8/1998 | Dewey et al. | 361/683 |
| 5,949,652 | A | * | 9/1999 | McAnally et al. | 361/726 |
| 6,040,981 | A | * | 3/2000 | Schmitt et al. | 361/695 |
| 6,236,563 | B1 | * | 5/2001 | Buican et al. | 361/685 |
| 6,270,046 | B1 | * | 8/2001 | Liu et al. | 248/231.9 |
| 6,272,009 | B1 | * | 8/2001 | Buican et al. | 361/683 |
| 6,304,443 | B1 | * | 10/2001 | Chou | 361/695 |
| 6,317,320 | B1 | * | 11/2001 | Cosley et al. | 361/695 |
| 6,556,437 | B1 | * | 4/2003 | Hardin | 361/687 |
| 6,582,150 | B1 | * | 6/2003 | Davis et al. | 403/330 |
| 6,592,449 | B2 | * | 7/2003 | Cipolla et al. | 454/184 |
| 6,604,916 | B2 | * | 8/2003 | Lu et al. | 417/360 |
| 6,616,525 | B1 | * | 9/2003 | Giraldo et al. | 454/184 |
| 6,639,796 | B2 | * | 10/2003 | Cannon | 361/695 |
| 6,668,565 | B1 | * | 12/2003 | Johnson et al. | 62/89 |
| 6,674,641 | B2 | * | 1/2004 | Jensen et al. | 361/687 |
| 6,826,048 | B1 | * | 11/2004 | Dean et al. | 361/695 |
| 6,896,611 | B2 | * | 5/2005 | Giraldo et al. | 454/184 |
| 7,068,505 | B2 | * | 6/2006 | Kosugi | 361/690 |

* cited by examiner

*Primary Examiner*—Derek S Boles
(74) *Attorney, Agent, or Firm*—Muncy, Geissler, Olds & Lowe, PLLC

(57) ABSTRACT

A quickly detached cooling fan mounting bracket for a computer, by which a cooling fan can be quickly removed away from a computer chassis without detaching any other peripheral devices, whereby a large enough computer inner space is exposed in order to facilitate rapid replacement of electrical components. The cooling fan mounting bracket includes a cooling fan receptive mount; a cooling fan; a connecting member, which allows the cooling fan receptive mount to be movably installed on the computer chassis; and a orienting member, which secures the cooling fan receptive mount and the cooling fan onto the computer chassis, and prevents the cooling fan from vibration during the normal operation. Compared with the conventional art, the present invention is easier to remove the cooling fan away from the chassis, thereby, facilitates rapid replacement or maintenance of the computer components.

13 Claims, 7 Drawing Sheets

QUICKLY DETACHED COOLING FAN MOUNTING BRACKET FOR COMPUTER

BACKGROUND OF THE INVENTION

The present invention relates in general to a cooling fan mount set by which a cooling fan is secured inside a electrical apparatus, and more particularly, to a quickly detached cooling fan mounting bracket for a computer, by which a cooling fan can be quickly removed away from a computer chassis without detaching any other peripheral devices, whereby a spacious computer inner space is exposed in order to facilitate rapid replacement of electrical components.

The design of electrical instruments today, and especially the desktop computer, focuses not only on processing speed and multifunction capability, but also on attaining a compact size and attractive appearance. In spite of its decreasing size, the desktop computer is even more powerful and has even more functions than ever is. The desktop computer can have this added power and functionality because there are more powerful electrical components installed thereinside.

In order to enhance the processing speed, a more powerful central processing unit (CPU) and a highly efficient chipset are incorporated into the smaller desktop computer. Even these electrical components themselves have more built-in elements than in the past. But because of these added elements, the CPU and the chipset generate more heat than ever. Because of this added heat larger and more effective thermal dissipation modules need to be installed in order to keep up with the increased heat production. Additionally, a desktop computer must have several standard electrical devices installed which include a high capacity storage unit (hard disk), a DVD player or disk burner or so-called COMBO drive, and a power supply, in order to satisfy the demand of the consumer. The interior of the desktop computer is, therefore, crowded by the previously mentioned electrical devices. There is no room left in the interior space of the desktop computer for a consumer to use his hand to replace electrical components. It is even harder for a consumer to reach electrical components located at the bottom of the desktop computer's interior.

The conventional art makes it inconvenient for the consumer to repair or upgrade his desktop computer. To replace an electrical component, a consumer must detach a larger electrical device, or all of the electrical devices which are located above the electrical component to be replaced. In addition to the standard desktop computer devices mentioned above, a large electrical device installed within the desktop computer is the thermal dissipation assembly, which also takes up considerable space within the desktop computer. If a thermal dissipation device can be designed so that it is easily removed, then that would mean more of the computer's interior could be easily exposed for computer servicing. By removing a thermal dissipation device there would be enough room at the bottom of the computer's interior for the consumer to fit his hand into. This added room at the bottom of the computer's interior would make servicing the other parts at that location more easily serviceable.

However, the conventional installment of the thermal dissipation assembly, and especially the cooling fan, has always been fixed according to a stationary method which requires that the fan be screwed onto the computer's chassis. This method does not make it easy for a consumer to remove the cooling fan. Further, because the thermal dissipation device is assembled before it is installed inside the computer's chassis, it is difficult to remove the cooling fan alone. A consumer must sequentially remove all of the electrical components installed above the thermal dissipation assembly in order to replace the cooling fan.

BRIEF SUMMARY OF THE INVENTION

The present invention provides a quickly detached cooling fan mounting bracket for a computer, which is utilized to remedy the installation and replacement problems of the electrical components of the conventional art. By utilizing the present invention, a cooling fan can be quickly removed away from a computer chassis without detaching any other peripheral devices to expose a large enough computer inner space for facilitating rapid replacement of electrical components.

In one preferred embodiment, a pivot axis is formed by the combination of a first connecting member and a second connecting member, which allows the cooling fan receptive mount and the cooling fan installed therein to rotate around the pivot axis and back out from the computer chassis. The cooling fan receptive mount and the cooling fan installed therein are capable of being rotated inverse into the computer chassis, and further secured on the chassis by an orienting member.

In another preferred embodiment, the connecting member formed by the combination of the first connecting member and the second connecting member is a pin axis combination, wherein the cooling fan receptive mount and the cooling fan can be removed easily from the chassis by means of the disconnection of the pin axis combination. The cooling fan receptive mount and the cooling fan installed therein are capable of being installed into the computer chassis by assembling the pin axis combination, and further secured on the chassis by an orienting member.

In other preferred embodiments, the connecting member can employ a set of small size hinges to pivotally connect the cooling fan receptive mount onto the chassis. The cooling fan receptive mount and the cooling fan installed therein are capable of being rotated out from the chassis for maintenance and rotated inverse into the chassis for installation.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These as well as other features of the present invention will become more apparent upon reference to the drawings therein.

DETAILED DESCRIPTION OF THE INVENTION

Figure 1:
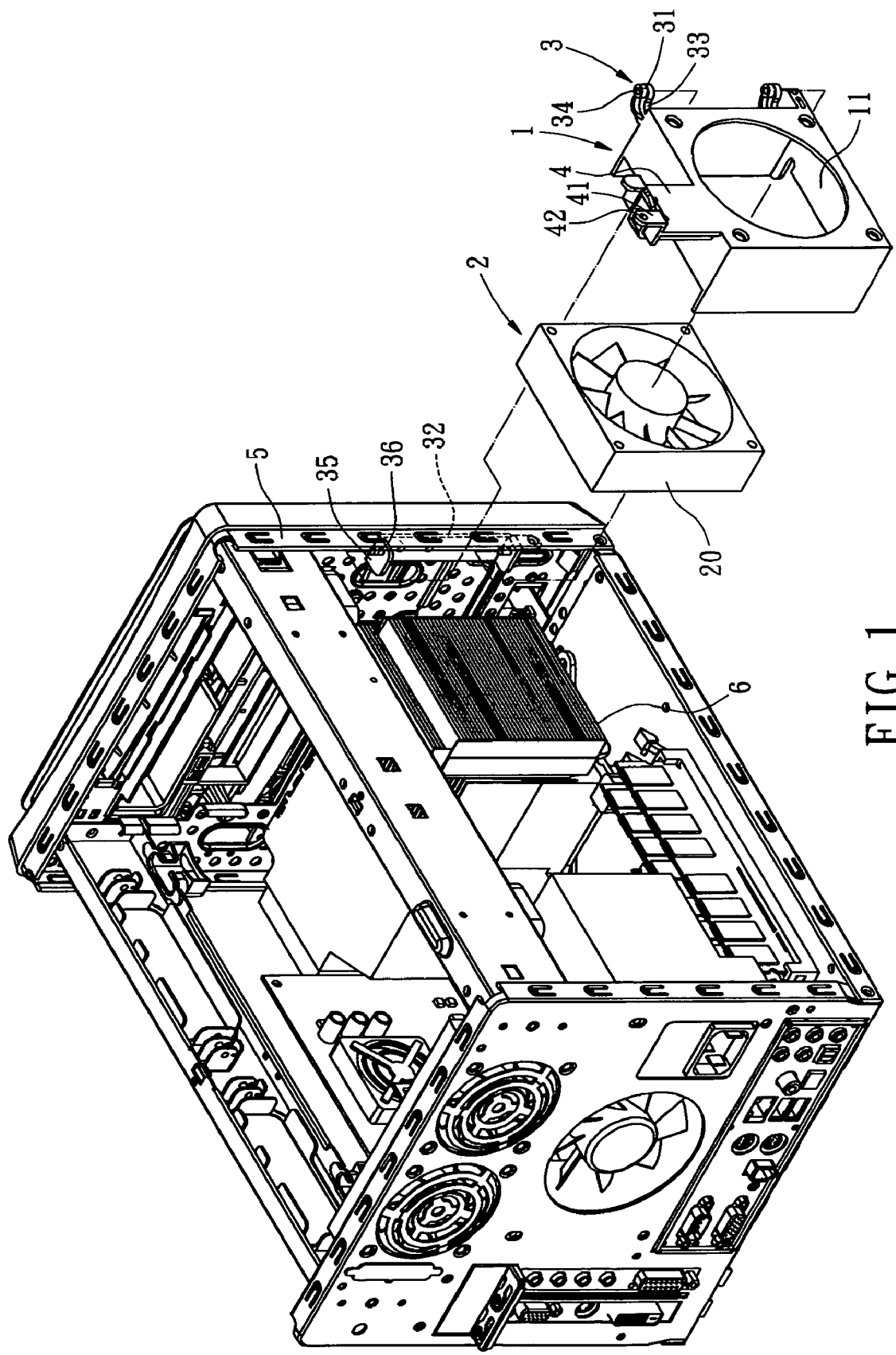
FIG. 1 is an exploded view of a cooling fan mounting bracket of one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Referring to FIG. 1, one embodiment of a quickly detached cooling fan mounting bracket for a computer in accordance with the present invention is shown. The cooling fan mounting bracket includes a cooling fan receptive mount 1; a cooling fan 2; a connecting member 3, which allows the cooling fan receptive mount 1 to be movably installed on the computer chassis 5; and a orienting member 4, which provides the cooling fan receptive mount 1 and the cooling fan 2 with a means for orientation and installment.

The cooling fan receptive mount 1 provides the cooling fan 2 with a moveable structure that the cooling fan 2 can be installed into. There is no special requirement regarding the style and the shape of the cooling fan receptive mount 1. The cooling fan receptive mount 1 disclosed in FIG. 1 is only one of its possible configurations. The cooling fan receptive mount 1 has a hollow receptive space 11 utilized to install the cooling fan 2, and a frame 10 on which the connecting member 3 and the orienting member 4 may be installed.

Figure 2:
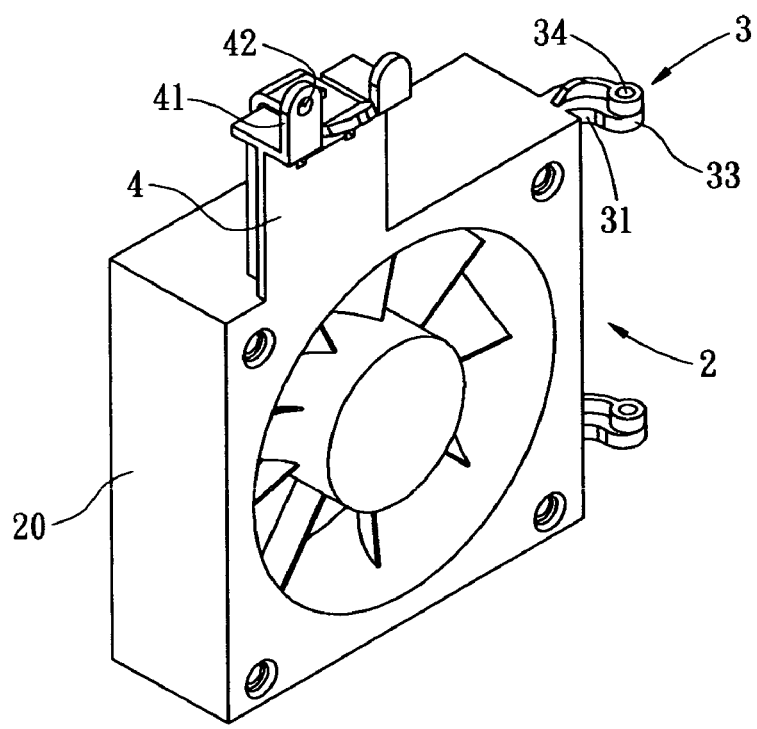
FIG. 2 is a perspective view of another embodiment of a cooling fan receptive mount in accordance with the present invention.

In other embodiments of the present invention, the cooling fan 1 is not limited to an independent structure member. The cooling fan receptive mount 1 can be incorporated into the cooling fan housing 20, as illustrated in FIG. 2, and incorporates the connecting member 3 and the orienting member 4 thereon. This configuration can attain the same thermal dissipation effect as well as the same goal that the cooling fan 2 is movably assembled onto the chassis 5.

The cooling fan 2 is installed inside the receptive space 11 in a stationary manner, it can be moved together with the cooling fan receptive mount 1. The cooling fan 2 in actual embodiments may employ a cooling fan used by a conventional thermal dissipation module 6. There is no special requirement for the type or specification of the cooling fan 2, as long as the thermal dissipation rate of the cooling fan 2 satisfies the requirements of the desktop computer.

Figure 3:
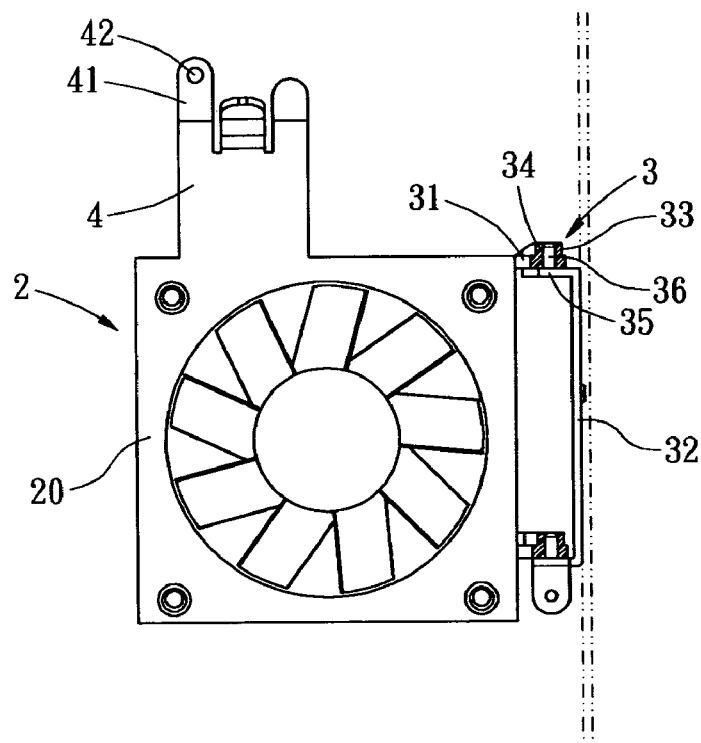
FIG. 3 is a partial cross-sectional view of a cooling fan mounting bracket, illustrating the usage of the connecting member.

The connecting member 3 movably assembles the cooling fan receptive mount 1 and the cooling fan 2 onto the chassis 5; therefore, the cooling fan 2 can be easily and quickly moved away from the chassis 5. It needs to be clearly understood that the connecting member 3 as shown in FIG. 1 and FIG. 3 is an illustrated embodiment. The connecting member 3 is not limited to the configuration shown. As long as a configuration can moveably connect the cooling fan 2 to the chassis 5, and can provide the cooling fan 2 an easy and quick removal from the chassis 5, the configuration can be utilized by the connecting member 3 of the present invention.

The connecting member 3, in one preferred embodiment shown in FIG. 1 and FIG. 3, comprises a first connecting member 31 and a second connecting member 32. The first connecting member 31 has a set of sleeve members 33 which have center holes 34 in their centers. The second connecting member 32 has a set of axis member 35 which have axis rods 36 on their top. By utilizing the center holes 34 of the first connecting member 31 and the axis rods 36 of the second connecting member 32, the first connecting member 31 is pivotally connected to the second connecting member 32, and can be rotated around the second connecting member 32.

Figure 4:
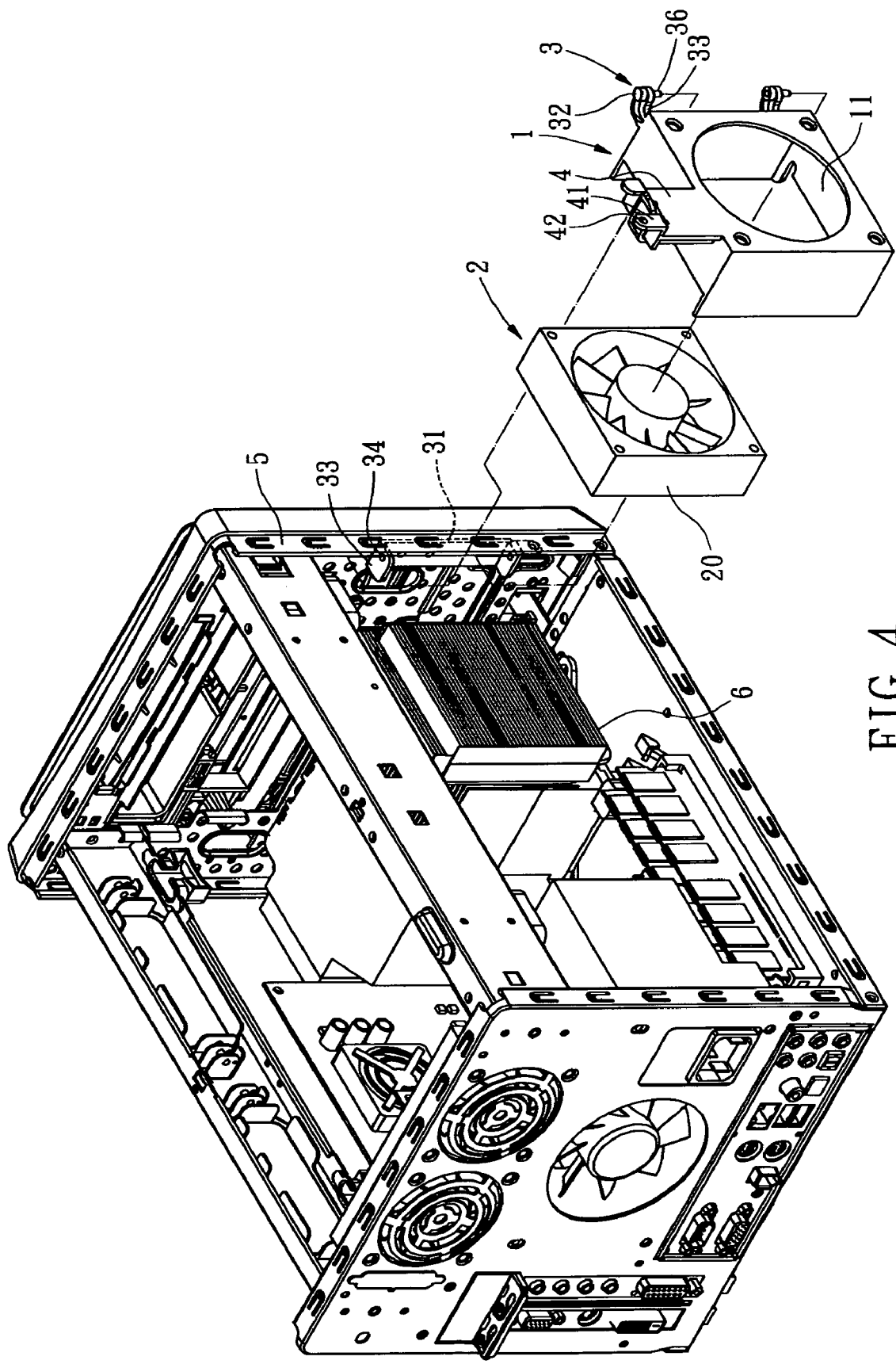
FIG. 4 is an exploded view of a cooling fan mounting bracket of one embodiment of the present invention, illustrating another configuration of the connecting member.

The first connecting member 31, in the practical embodiment disclosed in FIG. 1 and FIG. 3, has one or more sleeve members 33 formed on the side of the cooling fan receptive mount 1. The second connecting member 32 has the same amount of the axis members 35 installed on the chassis 5. The configurations of the first connecting member 31 and the second connecting member are not limited to the aforementioned method. The first connecting member 31 and the second connecting member 32 can be swapped; as illustrated in FIG. 4, the first connecting member 31 is installed onto the chassis 5, while the second connecting member 32 is formed at one side of the cooling fan receptive mount 1. This design also achieves the same goal of the present invention that the cooling fan 2 can be easily removed or rotated out from the chassis 5.

Figure 5:
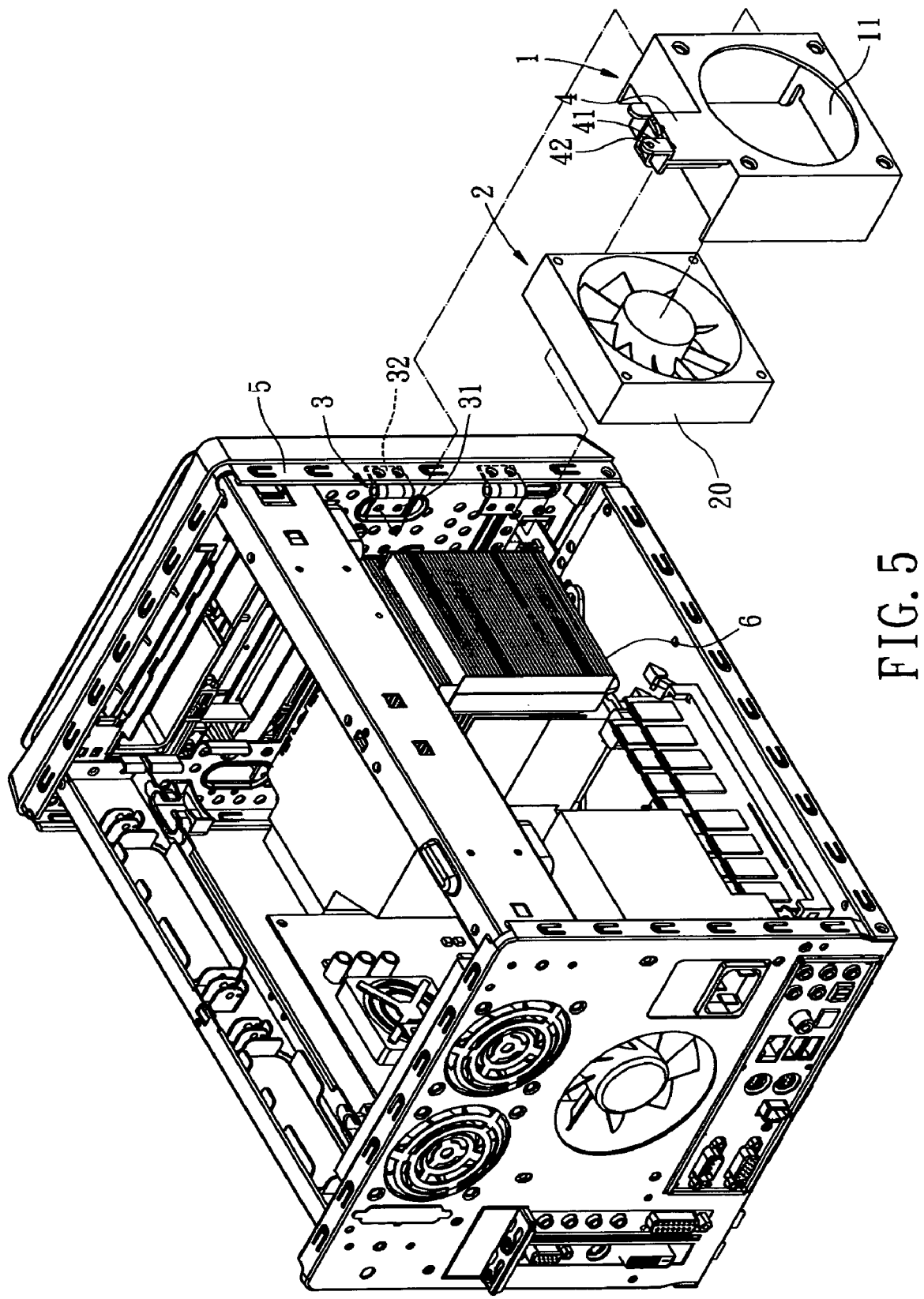
FIG. 5 is an exploded view of a cooling fan mounting bracket of one embodiment of the present invention, illustrating a further configuration of the connecting member.

In other practical and preferred embodiments, the connecting member 3 can also apply one or more conventional small hinges, as is illustrated in FIG. 5. It can also achieve the same goal of the present invention that the cooling fan 2 can be easily removed or rotated out from the chassis 5.

Further, because the connecting member 3 pivotally connects the cooling fan receptive mount 1 to the chassis 5, the cooling fan receptive mount 1 and the cooling fan 2 are movable after the installment of the connecting member 3. But during the normal operation, the cooling fan 2 must be secured to directly face the thermal dissipation module 6. The cooling fan 2 must face with the thermal dissipation module 6 in order to provide heat dissipation function; therefore, the orienting member 4 is utilized to further attach the cooling fan receptive mount 1 onto the chassis 5.

The orienting member 4, as illustrated in FIG. 1 through FIG. 3, is installed on the top of the cooling fan receptive mount 1 or the cooling fan housing 20 in a stationary manner. The orienting member 4 includes a screw-on tab 41 with a screw hole 42 thereon. By screwing a bolt through the screw hole 42 of the orienting member 4 to the chassis 5, the cooling fan receptive mount 1 and the cooling fan 2 are secured on the chassis 5; therefore, the cooling fan 2 directly faces with the thermal dissipation module 6 to perform its heat dissipation function.

Figure 6:
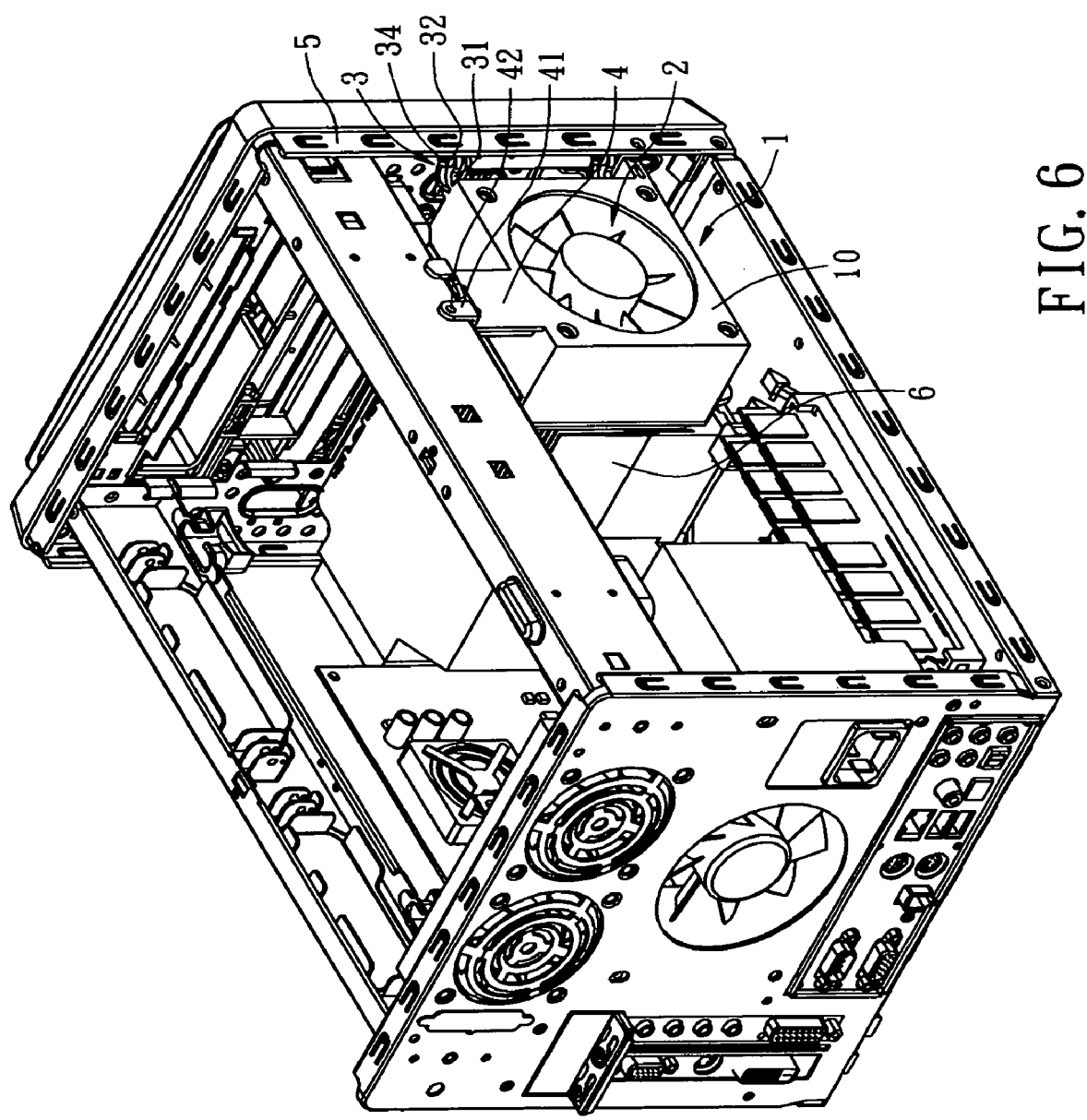
FIG. 6 is a perspective of a computer, showing a condition wherein the cooling fan mounting bracket incorporating a cooling fan inside is secured therein.
Figure 7:
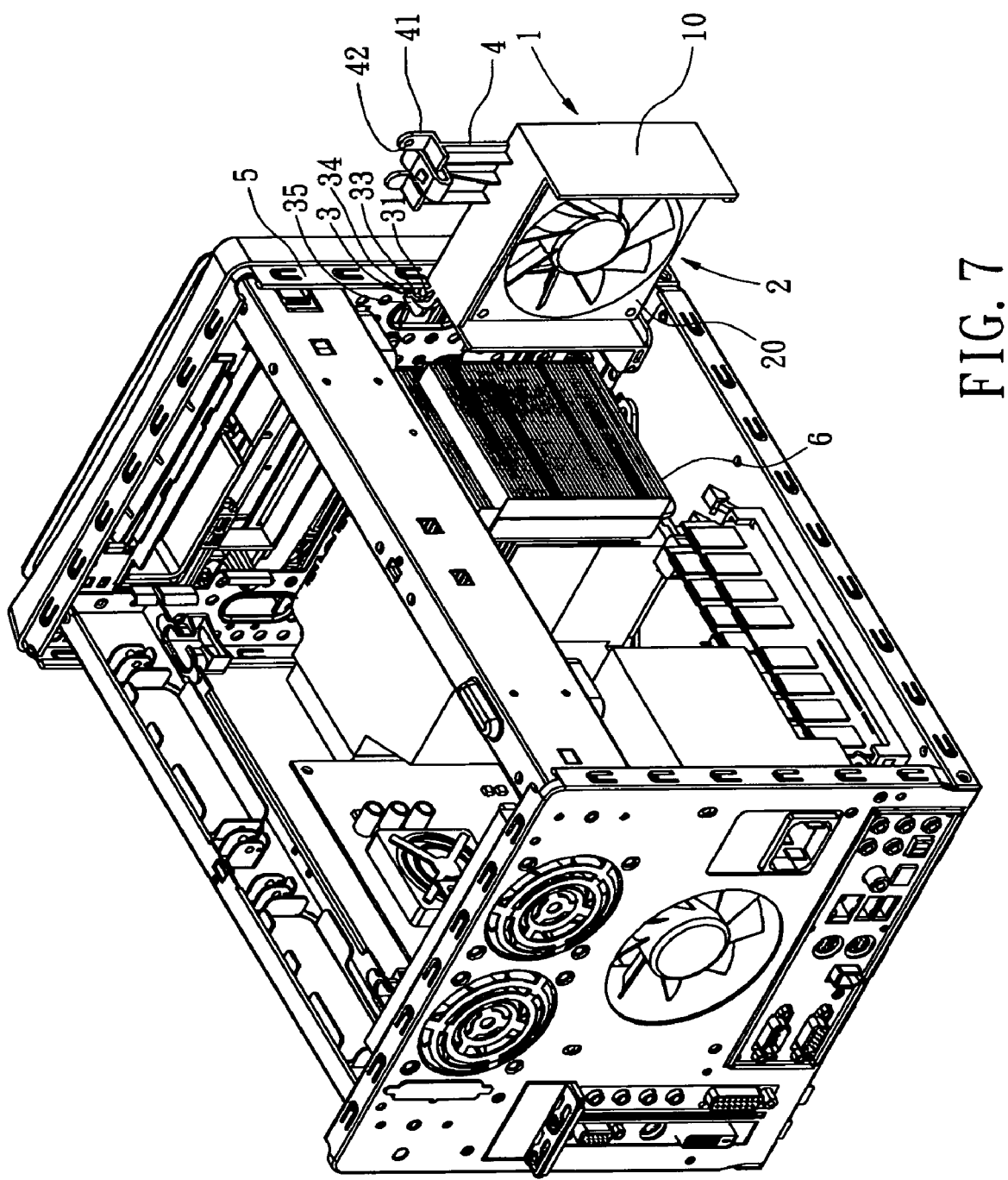
FIG. 7 is a perspective view of a computer, showing a condition wherein the cooling fan mounting bracket has been rotated out from the computer chassis.
Figure 8:
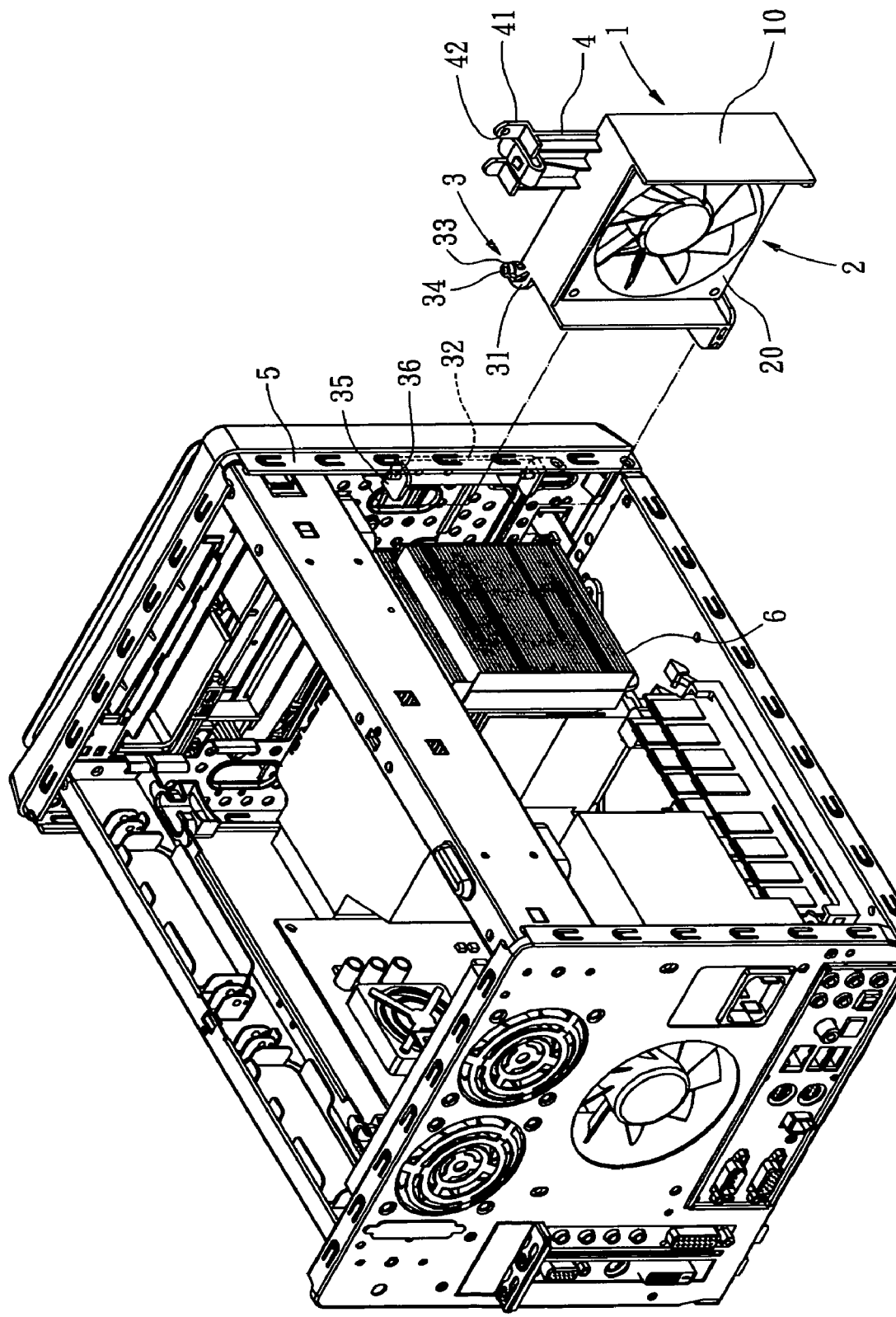
FIG. 8 is a perspective view of a computer, showing a condition wherein the cooling fan mounting bracket has been entirely detached away from the computer chassis.

Referring to FIG. 6 through 8, the cooling fan receptive mount 1 and the cooling fan 2 can be easily removed away from the computer chassis 5. The cooling fan 2 is assembled into the cooling fan receptive mount 1 in a stationary manner. The cooling fan receptive mount 1 is pivotally connected to the chassis 5 by utilizing the connecting member 3. The cooling fan receptive mount 1 is further secured onto the chassis 5 in a stationary manner by utilizing the orienting member 4. Therefore, the cooling fan 2 directly faces the thermal dissipation module 6 installed inside the chassis 5, as is illustrated in FIG. 6.

When compared to the conventional cooling fan installation method, the present invention is much more convenient for the replacement of electrical components and maintenance. With the present invention, the consumer does not need to remove the fixed electrical devices to replace or upgrade the desktop computer. By simply rotating the cooling fan assembly out from the chassis 5, a specific inner space of the chassis 5 is exposed. The exposed space is large enough for a consumer to reach the electrical components in order to perform the desired replacement. FIG. 7 and FIG. 8 show the rotational operation and entire detachment of the cooling fan 2. By utilizing the connecting member 3 of the present invention, the consumer can quickly detach the cooling fan 2 from the chassis 5. The connecting member 3 has the first connecting member 31 formed on the cooling fan receptive mount 1, and the second member 32 installed on the chassis 5. The first connecting member 31 and the second connecting member 32 are movably sleeved together. To remove the cooling fan 2 out from the chassis 5, the consumer needs merely releasing the locked status between the orienting member 4 and the chassis 5, and further rotating the cooling fan receptive mount 1 away from the chassis 5, as is illustrated in FIG. 7. Because of the sleeved connection of the first connecting member 31 and the second connecting member 32, the cooling fan receptive mount 1 and the cooling fan 2 can be further entirely detached from the chassis 5 by releasing this sleeved connection, as is illustrated in FIG. 8. Thereby, a large enough inner space of the chassis 5 is exposed so that a consumer can reach the electrical components in order to perform the desired replacement.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A quickly detached cooling fan mounting bracket, comprising:
    a cooling fan;
    a cooling fan receptive mount, providing the cooling fan incorporated therein;
    a connecting member, having a first and a second connecting member respectively and correspondingly disposed on the cooling fan receptive mount and a computer chassis, wherein the first connecting member and the second connecting member are pivotally connected together; and
    an orienting member installed on a top edge of the end surface of the receptive mount, being utilized to assemble and orient the cooling fan receptive mount and the cooling fan into the computer chassis, the orienting member including a screw-on tab with a screw hole thereon, capable of being inserted through by a bolt to secure and orient the cooling fan on the computer chassis,
    wherein the first connecting member and the second connecting member employ a detachable and pivotable axis connection, the first connecting member has a set of sleeve members, which has a center hole therein, and the second connecting member has a set of axis members, which has an axis rod thereon.

2. The cooling fan mounting bracket of claim 1, wherein the cooling fan receptive mount has a frame and a hollow receptive space utilized to install the cooling fan.

3. The cooling fan mounting bracket of claim 1, wherein the first connecting member is assembled and fixed on the surface of the cooling fan receptive mount while the second connecting member is installed into the computer chassis.

4. The cooling fan mounting bracket of claim 1, wherein the first connecting member is installed into the computer chassis while the second connecting member is assembled and fixed on the surface of cooling fan receptive mount.

5. A quickly detached cooling fan mounting bracket, comprising:
    a cooling fan;
    a cooling fan receptive mount, providing the cooling fan incorporated therein;
    a connecting member, having a first and a second connecting member respectively and correspondingly disposed on the cooling fan receptive mount and a computer chassis, wherein the first-connecting member and the second connecting member are pivotally connected together; and
    an orienting member installed on a top edge of the end surface of the receptive mount, being utilized to assemble and orient the cooling fan receptive mount and the cooling fan into the computer chassis, the orienting member including a screw-on tab with a screw hole thereon, capable of being inserted through by a bolt to secure and orient the cooling fan on the computer chassis,
    wherein the first connecting member is assembled and fixed on the surface of the cooling fan receptive mount while the second connecting member is installed into the computer chassis, and
    wherein the first connecting member and the second connecting member employ a detachable and pivotable axis connection, the first connecting member has a set of sleeve members, which has a center hole therein, and the second connecting member has a set of axis members, which has an axis rod thereon.

6. The cooling fan mounting bracket of claim 5, wherein the cooling fan receptive mount has a flame and a hollow receptive space utilized to install the cooling fan.

7. The cooling fan mounting bracket of claim 5, wherein the first connecting member and the second connecting member are a set of butterfly hinges.

8. A quickly detached cooling fan mounting bracket, comprising:
    a cooling fan;
    a cooling fan receptive mount, providing the cooling fan incorporated therein;
    a connecting member, having a first and a second connecting member respectively and correspondingly disposed on the cooling fan receptive mount and a computer chassis, wherein the first connecting member and the second connecting member are pivotally connected together; and
    an orienting member installed on a top edge of the end surface of the receptive mount, being utilized to assemble and orient the cooling fan receptive mount and the cooling fan into the computer chassis, the orienting member including a screw-on tab with a screw hole thereon, capable of being inserted through by a bolt to secure and orient the cooling fan on the computer chassis,
    wherein the first connecting member is installed into the computer chassis while the second connecting member is assembled and fixed on the surface of cooling fan receptive mount, and
    wherein the first connecting member and the second connecting member employ a detachable and pivotable axis connection, the first connecting member has a set of sleeve members, which has a center hole therein, and the second connecting member has a set of axis members, which has an axis rod thereon.

9. The cooling fan mounting bracket of claim 8, wherein the cooling fan receptive mount has a frame and a hollow receptive space utilized to install the cooling fan.

10. The cooling fan mounting bracket of claim 8, wherein the first connecting member and the second connecting member are a set of butterfly hinges.

11. A cooling fan mounting bracket of claim 1, wherein the fan may be removed quickly and easily, so as to allow access for rapid replacement of other components.

12. A cooling fan mounting bracket of claim 5, wherein the fan may be removed quickly and easily, so as to allow access for rapid replacement of other components.

13. A cooling fan mounting bracket of claim 8, wherein the fan may be removed quickly and easily, so as to allow access for rapid replacement of other components.

* * * * *